United States Patent
Fukushima et al.

(10) Patent No.: US 7,556,869 B2
(45) Date of Patent: Jul. 7, 2009

(54) ELECTRONIC DEVICE AND WIRING WITH A CURRENT INDUCED COOLING EFFECT, AND AN ELECTRONIC DEVICE CAPABLE OF CONVERTING A TEMPERATURE DIFFERENCE INTO VOLTAGE

(75) Inventors: Akio Fukushima, Ibaraki (JP); Hitoshi Kubota, Ibaraki (JP); Atsushi Yamamoto, Ibaraki (JP)

(73) Assignee: National Institute of Advanced Industrial Science and Technology, Tokyo (JP)

( * ) Notice: Subject to any disclaimer, the term of this patent is extended or adjusted under 35 U.S.C. 154(b) by 593 days.

(21) Appl. No.: 11/221,863

(22) Filed: Sep. 9, 2005

(65) Prior Publication Data

US 2006/0056113 A1 Mar. 16, 2006

(30) Foreign Application Priority Data

| Sep. 13, 2004 | (JP) | ............................. 2004-265962 |
| Jul. 4, 2005 | (JP) | ............................. 2005-195574 |

(51) Int. Cl.
*G11B 5/39* (2006.01)
*G11C 5/06* (2006.01)
*G11C 5/14* (2006.01)

(52) U.S. Cl. ........................ 428/816; 365/63; 365/171; 365/174; 360/313

(58) Field of Classification Search ....................... None
See application file for complete search history.

(56) References Cited

U.S. PATENT DOCUMENTS

| 5,940,319 | A  * | 8/1999  | Durlam et al. ............... 365/171 |
| 6,653,548 | B2 * | 11/2003 | Yamashita ................... 136/240 |
| 6,710,238 | B1 * | 3/2004  | Shingu et al. ................ 136/205 |
| 6,987,650 | B2 * | 1/2006  | Liu et al. .................... 360/313 |
| 6,999,339 | B2 * | 2/2006  | Tuttle et al. ................. 365/158 |
| 7,382,584 | B2 * | 6/2008  | Liu et al. .................... 360/313 |
| 2003/0117254 | A1 * | 6/2003 | Wan et al. ................. 338/32 R |
| 2004/0114425 | A1 * | 6/2004 | Ezaki et al. ................. 365/158 |
| 2004/0233584 | A1 * | 11/2004 | Liu et al. .................... 360/313 |
| 2007/0008656 | A1 * | 1/2007  | Liu et al. .................... 360/313 |

\* cited by examiner

*Primary Examiner*—Kevin M. Bernatz
(74) *Attorney, Agent, or Firm*—Reed Smith LLP; Juan Carlos A. Marquez, Esq.

(57) ABSTRACT

Localized temperature increases inside integrated circuits due to heating at operation are prevented or controlled by electronic devices or wirings with CPP (current-perpendicular-to-plane) structures which have a current cooling effect. A CPP structure refers to a structure comprising a columnar electrically conductive portion and an insulator portion surrounding the conductive portion. The columnar portion is formed from a multilayered structure in a direction perpendicular to the plane of the layers, so as to allow a current to flow from an upper layer to a lower layer (or vice versa). The cooling effect is induced by current at the interface (or a plural of interfaces) of appropriately selected different kinds of materials (which are conductive substances in general, such as metals, semiconductors, and alloys thereof) in the columnar portion due to the Peltier effect when a current flows through the column. Temperature in a minute range is detected by a thermocouple with the CPP structure. The thermocouple has two interfaces of different materials with a proper combination. When a temperature difference exists between the two interfaces, a voltage which corresponds to a product of the temperature difference and the Peltier coefficient at the interface is produced. In the same manner, the intensity of the infrared can be also measured.

6 Claims, 18 Drawing Sheets

EXAMPLE 1 OF AN INTEGRATED CIRCUIT WITH THE CPP-CIC WIRING

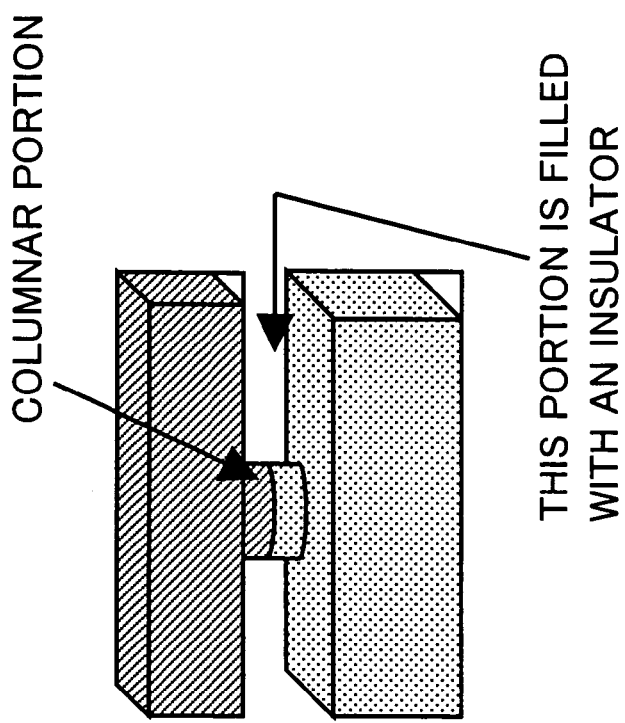
FIG. 1 B PERSPECTIVE VIEW
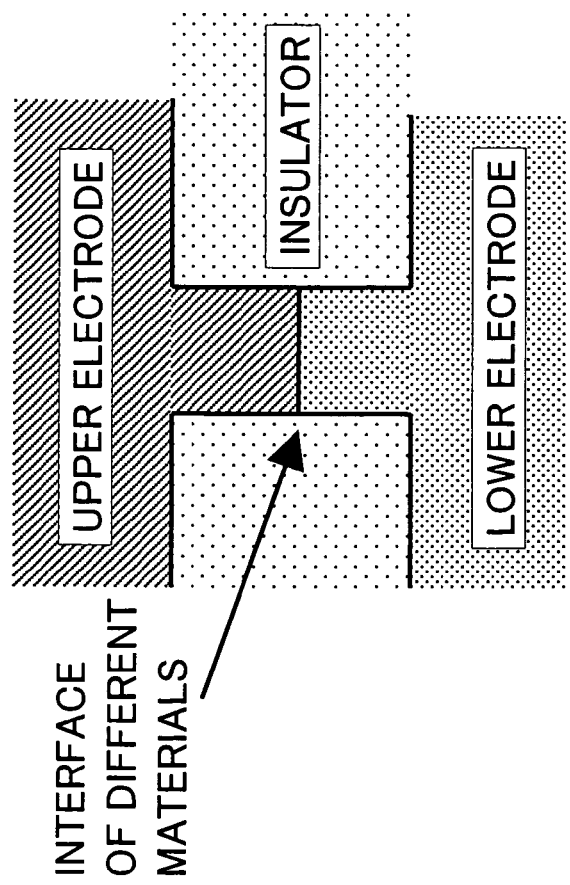
FIG. 1 A CROSS-SECTIONAL VIEW
CPP-CIC WIRING STRUCTURES OF THE COLUMNAR PORTION OF
THE CPP-CIC WIRING
FIG. 2 A TAPERED STRUCTURE
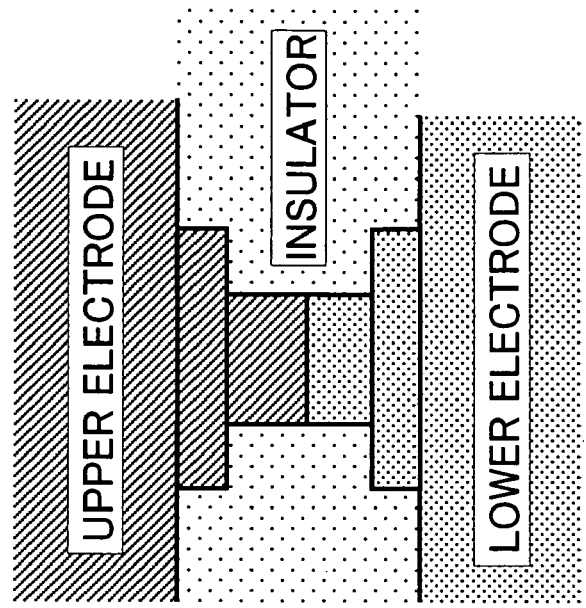
FIG. 2 B STEPPED STRUCTURE
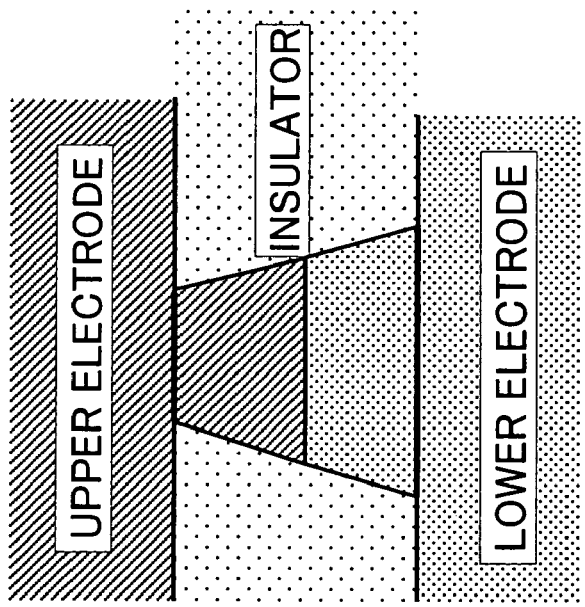

STRUCTURES OF THE COLUMNAR PORTION OF
THE CPP-CIC WIRING

STRUCTURE IN WHICH
A HEATING ELEMENT
IS SANDWICHED VERTICALLY

STRUCTURE IN WHICH
A HEATING ELEMENT
IS SANDWICHED HORIZONTALLY

CPP-GMR DEVICE WITH THE CPP STRUCTURE

MR CURVE OF THE CPP-GMR DEVICE SHOWN IN FIG. 4

DIRECTION OF CURRENT FOR PRODUCING THE COOLING EFFECT

COOLING EFFECT OBSERVED WHEN CURRENT FLOWS

CONFIGURATIONS OF CPP-CIC WIRING

CURRENT COOLING EFFECT PROVIDED BY THE CPP-CIC WIRING
CURRENT-RESISTANCE CHARACTERISTICS OF A CPP-STRUCTURE CURRENT COOLING ELEMENT

STRUCTURE OF A MAGNETIC SENSOR COMPRISING A CPP-GMR DEVICE WITH A CPP-CIC WIRING

MAGNETIC MEMORY COMPRISING A CPP-GMR DEVICE WITH A CPP-CIC WIRING

APPLICATION OF THE CPP-CIC
WIRING TO A CIP-GMR MAGNETIC HEAD

APPLICATION OF THE CPP-CIC WIRING TO A DIODE

APPLICATION OF THE CPP-CIC WIRING TO AN FET

EXAMPLE 1 OF AN INTEGRATED CIRCUIT WITH
THE CPP-CIC WIRING

EXAMPLE 2 OF AN INTEGRATED CIRCUIT WITH THE CPP-CIC WIRING
FIG. 17 A
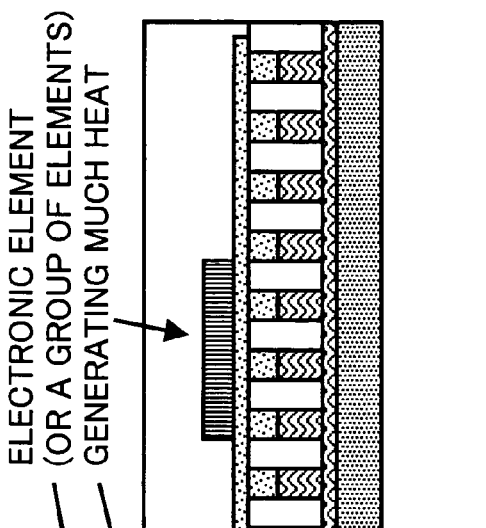
FIG. 17 B
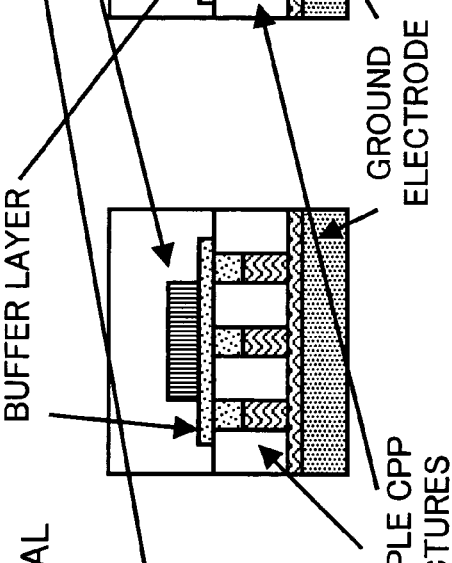
FIG. 17 C
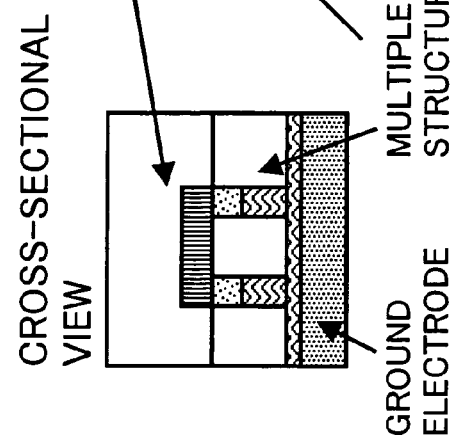
TOP VIEW
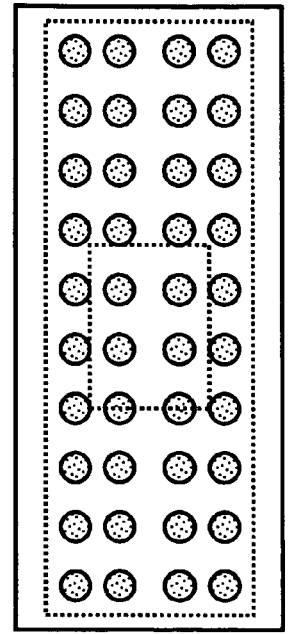
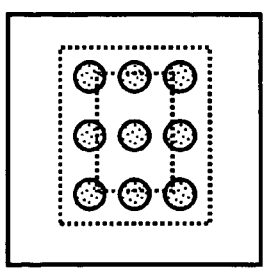
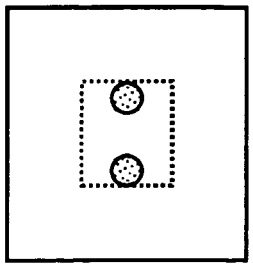

EXAMPLE 3 OF AN INTEGRATED CIRCUIT WITH THE CPP-CIC WIRING

APPLICATION OF THE CPP-STRUCTURE CURRENT
-COOLING DEVICE TO A TEMPERATURE SENSOR $V = \Pi \times \Delta T$ $\Pi$ IS THE PELTIER COEFFICIENTS BY MATERIALS 1 AND 2

EXAMPLES OF STRUCTURE OF THE
CPP-STRUCTURE TEMPERATURE SENSOR

INTERFACE EXISTS IN
THE LOWER ELECTRODE

INTERFACES EXIST IN THE UPPER
AND LOWER ELECTRODES

π-TYPE CPP-STRUCTURE TEMPERATURE SENSOR

AERIAL π-TYPE CPP-STRUCTURE TEMPERATURE SENSOR

MICROCHIP-TYPE BIOSENSOR WITH A
BUILT-IN CPP-STRUCTURE TEMPERATURE SENSOR

ELECTRONIC DEVICE AND WIRING WITH A CURRENT INDUCED COOLING EFFECT, AND AN ELECTRONIC DEVICE CAPABLE OF CONVERTING A TEMPERATURE DIFFERENCE INTO VOLTAGE

BACKGROUND OF THE INVENTION

1. Field of the Invention

The present invention relates to an electronic device and a wiring with a current induced cooling effect, such that internal elements of the electronic device can be directly cooled. The invention also relates to an electronic device capable of converting a temperature difference into a voltage.

2. Background Art

As a size of internal electronic elements used in integrated electronic devices (such as IC, LSI, and ULSI) becomes smaller and a level of their integration increases, the amount of heat generated inside the integrated devices increases. If the heat dissipation inside the devices increases over the operation limit, the devices may malfunction or might break down. it is therefore an important design issue how to cool the devices, especially to remove the heat generated inside the package to the outside. Until now, conventional cooling methods are used as the followings:

1. Use a material with high heat conductivity in the package of the devices;
2. Attach a heat-dissipating fin on the surface of the package;
3. Attach a heat-dissipating fin on the surface of the package, and blow on that fin by using an electronic fan; and
4. Install a water-cooled radiator or a Peltier cooling device attached on the surface of the package.

Because these methods are the cooling from the outside of the package, it becomes inherently difficult to remove the heat generated inside integrated circuits to the outside as the sizes of electronic devices become smaller.

Particularly in highly-integrated electronic devices, a multilayered structure is indispensable. In such structure the via-hole type wirings (interconnections) of sub-micron diameter are often used, which has a columnar shape connecting the layers by a conductor and are surrounded with an insulator. Since this wiring is fabricated perpendicularly to the plane of the layers and current flows along the structure, that shape is sometimes called as a CPP (current-perpendicular-to-plane) structure. As the size of a CPP structure wiring decreases, it is difficult to remove the Joule heating (resistive-heating by current) at the structure to the outside of the package.

When the current-resistance characteristics of a CPP structure wiring made of a single conducting material are measured, an increase in resistance that is proportional to the square of the current is observed. In the case of a CPP structure wiring made of a conventional metal (such as gold or copper) whose cross section is approximately 0.1 micrometers square, for example, an increase in resistance values corresponding to an increase of temperature of several to a dozen degrees is observed when a current of 1 mill-ampere flows. This phenomenon cannot be avoided no matter how the electronic device is cooled from the outside.

To remove the heat generated inside an electronic device to the outside efficiently, a semiconductor device that has a Peltier cooling device inside the package as the separate circuit has been proposed (Patent Document 1). In this method, however, the following problems arise:

1) Separate power is required for the cooling device;
2) Because the cooling circuit is separate from the main circuit to be cooled, the Peltier cooling part should be electrically isolated from the main circuit to be cooled. Therefore a large time constant should exist in dissipation of the heat, since the heat conductivity of the insulator is generally poor as compared with that of a conductor.

There is also another problem of how to measure the local generation of heat inside an electronic device. The temperature of an electronic device has been measured using a temperature sensor such as a thermistor, a thermocouple, or by measuring the intensity of infrared radiation (a radiation thermometry). These methods, however, have the following problems:

1) Temperature can be measured only from the outside of the device; and
2) Positional resolution of temperature that can be achieved is no more than several micrometers.

Positional resolution is limited by the size of the temperature sensor, or by the size of pixels (constituent elements) of a heat-analyzing device. Here, the heat-analyzing devices are an array of the photodiodes, photoconductive effect elements, CdS cells and so on, which are arranged in the matrix shape so as to provide the thermal-information in planar distribution. Those are the similar configuration of a CCD sensor in a digital camera. A Peltier effect in a CPP structure in micron size was reported (Non-patent Document 1); however, no method has been proposed whereby the temperature of an element inside an integrated circuit can be measured directly and locally.

Patent Document 1: JP Patent Publication (Kokai) No. 08-274226 A (1996)

Non-patent Document 1: X. Fan, G. Zeng, C. LaBounty, E. Croke, C. C. Ahn, S. Huxtable, A. Majumdar, and A. Shakouri; "SiGeC/Si superlattice microcoolers," Appl. Phys. Lett., vol. 78 (2001), pp. 1580.

SUMMARY OF THE INVENTION

It is an object of the invention to solve the aforementioned problems of the conventional art, and to prevent or control a localized heating inside an integrated electronic device.

It is another object of the invention to provide a temperature sensor or an infrared sensor that produces a voltage corresponding to a temperature difference.

The invention provides a CPP structure electronic device which has a current induced cooling (Peltier cooling). Hereafter, that structure is referred as "a CPP-CIC (current-induced-cooling) structure" and the device with a CPP-CIC structure is referred as "a CPP-CIC device." The CPP structure comprises a columnar portion formed perpendicularly to the plane of thin films (or layers) and current flows along the columnar portion. The CPP-CIC structure has an interface of different kinds of materials inside the columnar portion. In accordance with a proper combination of the materials at the interface, a current induced cooling is provided when a current flows along the columnar portion.

The invention also provides a CPP structure wiring (or interconnect) with a cooling effect, which is formed inside a semiconductor integrated circuit. Hereafter that wiring is referred as "a CPP-CIC (current-induced-cooling) wiring." The CPP structure has a columnar portion formed perpendicularly to the plane of thin films (or layers), wherein current flows along the columnar portion. The CPP structure has an interface of different kinds of materials inside the columnar portion. At the interface of the different kinds of materials, a current induced cooling is provided when a current flows along the columnar portion. This CPP-CIC wiring functions not only as an electric lead connected to a power supply or as an interconnection between electronic elements inside the integrated circuit, but also as a heat absorber by current.

In accordance with the CPP-CIC device and the CPP-CIC wiring of this invention, the heat inside the integrated circuits can be directly avoided (or reduced).

The invention also provides a CPP-CIC structure electronic device capable of converting a temperature difference into a voltage. Hereafter that device is referred as "a CPP thermocouple." The columnar portion of the CPP thermocouple is formed perpendicularly to the plane of thin films (or layers). The CPP-structure has two interfaces of different kinds of materials, which are capable of measuring a temperature difference between the two interfaces based on the Peltier effect.

Further, the CPP thermocouple of the invention is capable of functioning as an infrared sensor by generating a voltage corresponding to the intensity of the inferred ray.

BRIEF DESCRIPTION OF THE DRAWINGS

FIG. 1 shows a structure of a CPP-CIC wiring. FIG. 1(A) shows a cross section and FIG. 1(B) shows a perspective view.

FIG. 2 shows structures of a columnar portion of the CPP-CIC wiring, FIG. 2(A) showing a tapered structure while FIG. 2(B) showing a stepped structure.

FIG. 3(A) shows a structure in which a heat-generating element is sandwiched vertically, and FIG. 3(B) shows another structure in which a heat-generating element is sandwiched horizontally.

FIG. 17 shows a second example of the application of the CPP-CIC wiring to an integrated circuit.

DESCRIPTION OF THE PREFERRED EMBODIMENTS OF THE INVENTION

Figure 3:
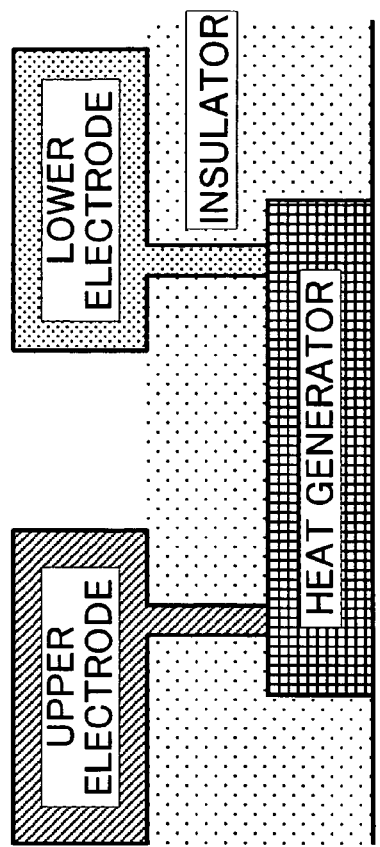
FIG. 3 shows different structures of the column of the CPP-CIC wiring from those of FIG. 2.
Figure 3:
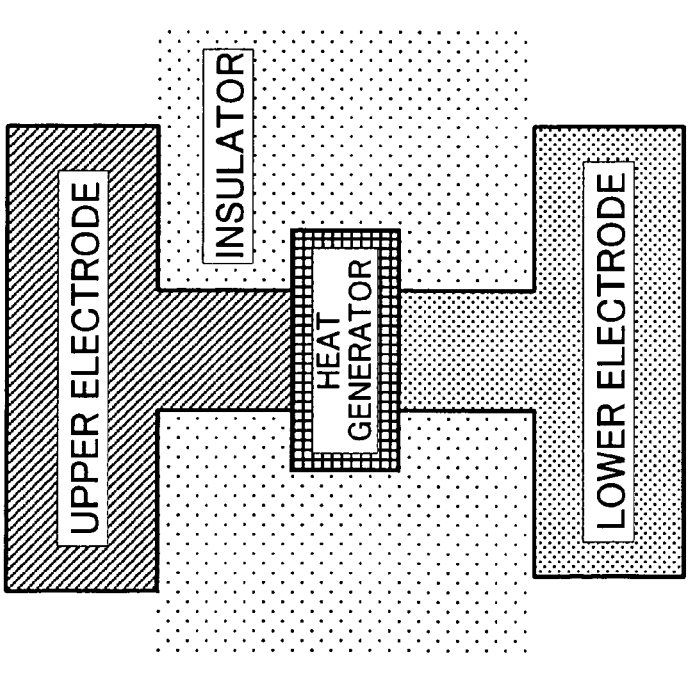

The object of reducing the amount of heat generated inside a high density integrated circuit is achieved by providing CPP (current-perpendicular-to-plane)—CIC (current-induced-cooling) devices or CPP-CIC wirings.

In the CPP-CIC structure, a current induced cooling is achieved by providing the interface of a proper combination of materials (or a plurality of materials) in the columnar part. When current flows through the interface, areas near the interface are cooled by Peltier effect.

The invention will be hereafter described by way of examples. FIG. 1 shows an example of the CPP-CIC wiring. FIG. 1(A) shows a cross section and FIG. 1(B) shows a perspective view. The CPP structure in accordance with the invention will be described below. The CPP structure comprises a columnar conducting portion and an insulating portion (generally consisting of an interlayer insulation film) surrounding the conducting portion. This structure is fabricated into a columnar shape perpendicular to a multilayered base film for causing current to flow from an upper layer to a lower layer (or in the opposite direction).

As shown in FIG. 1, the CPP-CIC structure comprises an upper electrode and a lower electrode made of different materials, where a columnar portion is extended integrally from each electrode via which the electrodes are joined. In the columnar portion of this CPP-CIC structure, where the conductor of the CPP-CIC structure has the smallest diameter, the size of the cross-section (which is the diameter in the case of a circular column; the length of a longer side in the case of a rectangular column; or the size of a portion with the greatest width in other shapes) is on the order of micrometers or smaller. The columnar portion of the CPP-CIC structure has a junction interface of different materials (such as metal, semiconductor, or conductive materials). By appropriately selecting the combination of materials and the direction of current, a current induced cooling effect is produced at the interface when current flows through the interface.

The heat balance of an electronic circuit in which the Peltier effect is exhibited is described in the following. When current flows through an interface between different kinds of conductive materials, current induces cooling (or heating) at the interface. The amount of the cooling (or heating) by current is proportional to the difference of thermoelectric powers (Seebeck coefficients) of the materials comprising the interface. This is referred to as the Peltier effect.

In the case of a closed circuit with many interfaces of different conductive materials, sum of the cooling and the heating should be zero. Namely, in the CPP-CIC wiring of the invention, the heating which is as much as the cooling in the columnar part should occur simultaneously at elsewhere. However, because the cross-sectional area and volume of other portion (upper and lower electrode) of the CPP-CIC wiring are much larger than that of the columnar portion by several orders of magnitude, that heating does not normally pose a problem.

The dimensions of columnar part of a CPP-CIC structure are desirably less than 1 micrometer square in cross-sectional size, less than 1 micrometer in length, and less than 10 Ω/micrometer-square in resistance-per-area. Here, the resistance-per-area is the resistance normalized by the cross-sectional size of the columnar part.

FIG. 2 shows the structure of the column in the CPP-CIC wiring in greater detail. FIG. 2(A) shows a tapered structure, and FIG. 2(B) shows a multi-stage structure. The columnar portion may be either conical (tapered) shape as shown in FIG. 2(A), or in multiple-steps-shape as shown in FIG. 2(B). The location of the interface does not necessarily need to be at the narrowest portion. For example, the interface may be placed at the boundary between the upper or lower electrode and the columnar portion. Alternatively, the aforementioned structures may be combined in various shapes, such as a pin-cushion shape with the narrowest center portion, a rhombus shape with the narrowest top and bottom, a step-shape with the size decreasing or increasing towards the top. The interface may locate inside the upper electrode or lower electrode, where an upper electrode or lower electrode is considered to be a CPP-CIC wiring in a wider sense. Although a cooling effect can be expected in the above structure too, the cooling power per unit area decreases as the cross-sectional area increases.

It is also possible to put a heat-load, which is an electronic element to be cooled, inside the CPP structure. Specifically, when the size of the heat-load is of the order of that of the CPP structure, the heat-load can be disposed at the cooling interface (the interface between two kinds of materials in a combination such that cooling takes place). To accommodate such an arrangement, it is also possible to divide the columnar portion of the CPP-CIC structure into two parts. FIG. 3(A) shows an example in which the heat-load is disposed at a cooling interface in the vertical direction. FIG. 3(B) shows another example in which the heat-load is disposed horizontally between two divided columns of a CPP-CIC structure. In the case of FIG. 3(B), the upper electrode and lower electrode are defined on the base of the direction of flow of current. Here, the electrode upstream of a positive current (i.e., on the side of the source of current) is defined as the lower electrode, and the electrode downstream of the current (i.e., on the side towards which current flows) as the upper electrode.

Figure 4:
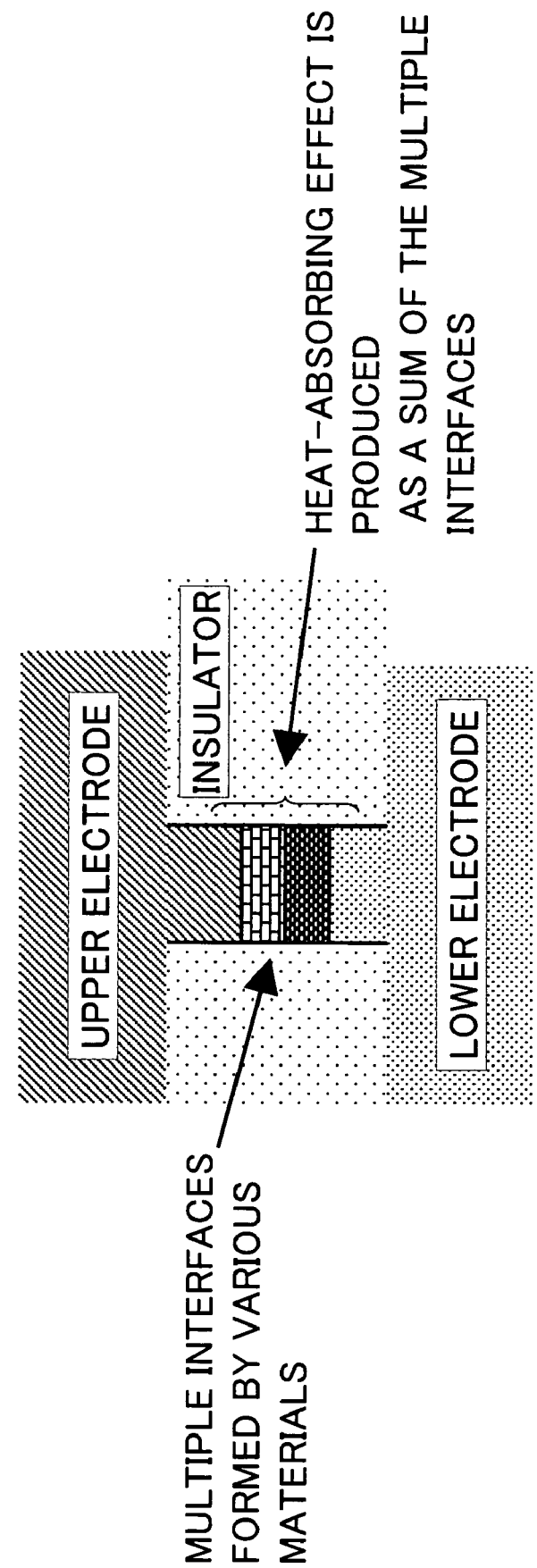
FIG. 4 shows an example of the CPP-CIC wiring comprising various kinds of materials.

In the simplest case, the interface consists of two kinds of conductive materials, one at the top and the other at the bottom. Moreover, it is possible to adopt a multilayer structure consisting of three or more kinds of conductive material. In such a multilayer structure, a buffer layer material may be disposed between layers during the process of making a CPP structure. In the plural interfaces of a multilayer structure, some of the interfaces might generate heating. It is possible to design the multilayered structure to be exhibited the cooling as the whole CPP structure. FIG. 4 shows an example of the CPP-CIC wiring made of plural kinds of materials.

Examples of the material for the columnar conducting portions in the CPP-CIC structure include: metals such as gold, copper, platinum, titanium and alloys thereof (the term "alloy" herein refers to alloys consisting of a base material to which an additive or additives are mixed in proportions smaller than that of the base material); magnetic metals such as cobalt, iron, nickel, chrome and alloys thereof; alloys of metal and magnetic material; semiconductors such as silicon, germanium, gallium-arsenide, and alloys thereof (such as silicon-germanium, silicon-germanium-carbon); and thermoelectric materials and alloys thereof, such as bismuth-tellurium and antimony-tellurium, whose resistance values are smaller than that of the surrounding insulator. Examples of the insulator include silicon oxide, aluminum oxide, magnesium oxide, silicon nitride, and diamond, whose resistivities are greater than that of the columnar conducting material.

In a preferred combination of materials, a metal, a semiconductor and/or a conducting material are combined such that the absolute value (the difference between a maximum value and a minimum value when the combination consists of two or more materials) of the difference in the Seebeck coefficients of the individual materials is not less than 10 μV/K. In this way, greater cooling power (or cooling capability) can be obtained.

EXAMPLE 1

Figure 5:
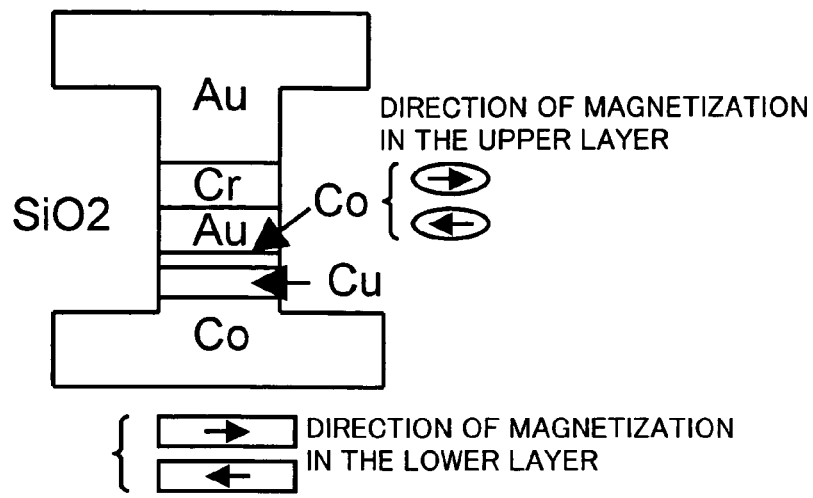
FIG. 5 shows an example of a CPP-GMR (giant-magneto-resistance) device made of a magnetic metal multilayered film.

With reference to FIG. 5, an example of a CPP-CIC device is described. Here, a CPP-GMR (giant-magneto-resistance) device with CPP-CIC structure is considered. This device was prepared by processing a multilayered film of metals (of magnetic metals) formed on a thermally oxidized silicon wafer into the CPP structure by microfabrication.

The film on the thermally oxidized silicon is a multilayered metal film comprised of chrome (lower layer) of 10 nm, cobalt (lower layer: magnetic fixed layer) of 25 nm, copper (intermediate layer) of 5 nm, cobalt (upper layer: magnetic free layer) of 2 nm, gold (lower layer) of 10 nm, chrome (upper layer) of 10 nm, and gold (upper layer) of 200 nm. In this structure, the layers important to the GMR effect are the magnetic fixed layer, the intermediate layer, and the magnetic free layer. The other layers are buffer layers for better adhesiveness or electrode layers.

This film was processed by microfabrication into a columnar shape with a cross section of 200 nm×70 nm, and the surrounding areas were filled with silicon oxide, thereby forming a CPP structure. The columnar portion consists of the lower layer [cobalt (magnetic fixed layer and lower electrode), copper, cobalt (magnetic free layer), gold (cap layer)] and the upper layer [chrome (adhesion layer), gold (top electrode)] with a total length of 60 nm.

The GMR effect is briefly discussed in the following. This device has two ferromagnetic layers, namely, the lower cobalt layer (magnetic fixed layer) and the upper cobalt layer (magnetic free layer), where the direction of the easy axis of magnetization of both layer is identical. Depending on the direction of magnetization of both layers, the resistance value of the GMR device varies greatly. Further, because these two layers have different coercivities (the magnitude of magnetic field necessary for changing the direction of magnetization), the directions of the magnetization of both layers can be either aligned in the parallel or the antiparallel configuration by sweeping an external magnetic field. When directions of magnetization in both layer are aligned in parallel, resistance becomes lower due to little scattering of electrons, whereas when the directions of magnetization of the two layer are in antiparallel, resistance becomes higher due to much scattering of electrons.

Figure 6:
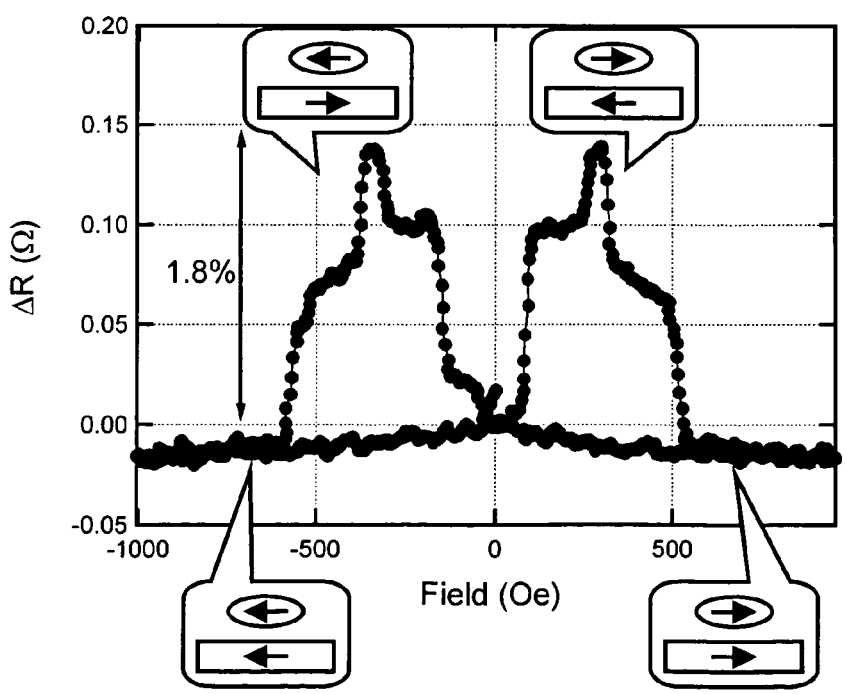
FIG. 6 shows changes in the resistance of the CPP-GMR device shown in FIG. 5 with respect to a magnetic field.

FIG. 6 shows the change in the resistance of the GMR device shown in FIG. 5 with respect to an external magnetic field. When a strong magnetic field is applied in one direction (which is defined as the positive direction of the magnetic field for the sake of convenience) along the axis of easy magnetization, the directions of the magnetization of the magnetic fixed layer and the magnetic free layer are aligned parallel in the positive direction (indicated by the arrow pointing to the right in the drawing for convenience' sake). As the magnetic field is gradually brought back to zero and then further swept in the negative direction, firstly the magnetization of the free layer which has a smaller coercivity is inverted, thereby exhibiting a greater resistance value; secondly the magnetization of the fixed layer which has a larger coercivity is inverted, such that the resistance value is returned back to the original value. If the magnetic field is set in the large negative direction and is swept in the positive direction in vice versa, the resistance changes in accordance with the configuration of the magnetization of the two layers by the same way, except for the fact that the directions of the magnetization are opposite. Consequently, the resistance greatly varies depending on the configuration of the direction of the magnetization of the magnetic free layer and the magnetic fixed layer. This phenomenon is called as GMR (giant-magneto-resistance), and a device showing this phenomenon is referred as a GMR device. GMR devices are used currently, such as magnetic-field sensors capable of converting a change in magnetic field into a change in resistance, and memory devices in which the high and low values of resistance are associated with 0s and 1s.

Figure 7:
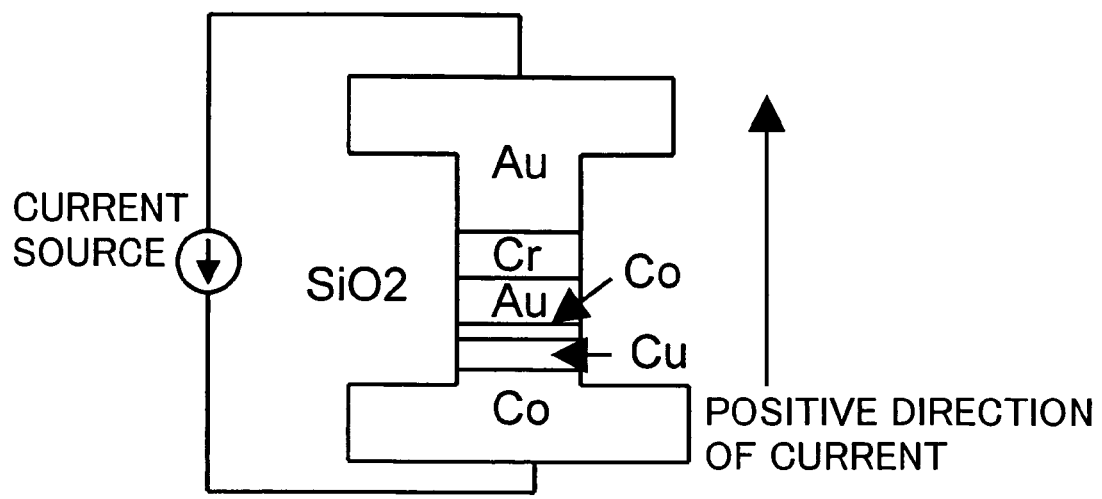
FIG. 7 shows how the direction of current is defined in the CPP-GMR device shown in FIG. 5.
Figure 8:
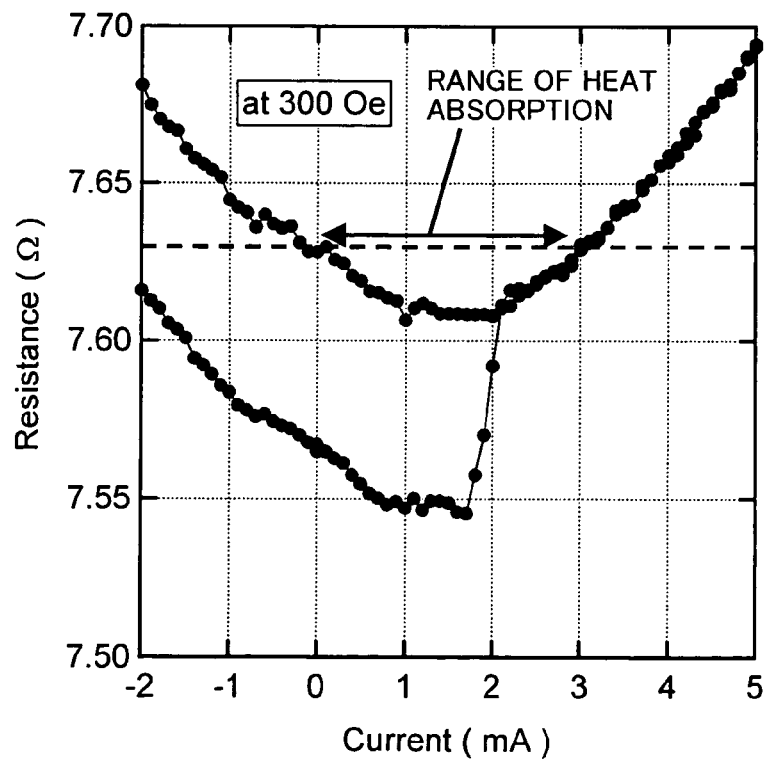
FIG. 8 shows the current-resistance characteristics of the CPP-GMR device shown in FIG. 5.

Hereafter we discuss the current cooling effect in the CPP-CIC device shown in FIG. 7, which is the same as that in FIG. 5. Here, the direction of current from bottom layer to top layer was defined as positive, which is shown in FIG. 7. FIG. 8 shows the resistance(R)—current (I) curve of that device, where current is direct-current. As shown in FIG. 8, in the range of current values between 0 to 3 milliamperes, the resistance value decreased from the zero current resistance (the resistance at zero current). Because that temperature dependence of the resistance of metals at room temperature are almost constant and that this CPP-GMR device was made of the metal films (gold, copper, cobalt, and chrome), the decrease in the resistance value is direct evidence of cooling effect. It was estimated that the maximum temperature decreased on the order of several to a dozen degrees near the CPP structure by the current cooling effect. A jump in the resistance value as shown in FIG. 8 is due to the current induced magnetization reversal, and it has no relationship with the current cooling effect.

Generally, the Peltier coefficient at the interface of two kinds of materials A and B is equal to the product of the difference in thermoelectric powers of the individual materials and temperature, as follows:

$$\pi = (S_A - S_B) \times T, \quad (1)$$

where $\pi$ is the Peltier coefficient, $S_A$ and $S_B$ are the thermoelectric power (which is also referred to as the Seebeck coefficient) of the individual materials, and T is temperature. Hereafter the range of current where the current cooling effect can be observed is discussed. When a CPP structure can be assumed to be thermally adiabatic from the outside, the thermal budget is expressed by:

$$\Delta W = RI^2 - \pi I, \quad (2)$$

where $\Delta W$ is the amount of heat generated or absorbed in the CPP structure, R is the resistance value of the CPP structure, I is the current, and $\pi$ is the Peltier coefficient at the interface (or the sum of Peltier coefficients when there are more than one interfaces in the CPP structure). In Eq. (2), the first term in the right-side member represents the amount of the Joule heating (the resistive heat generation), while the second term represents the amount of the cooling by the Peltier effect. From this equation, it can be seen that the cooling effect by the current can be obtained in the range of current between zero and $\pi/R$.

In the CPP-CIC device shown in FIG. 7, the Peltier effect will be equal to that at the cobalt-gold interface, since Peltier effects at other interfaces are cancelled within the range of the first-order approximation due to the symmetry in the layered structure. Using the Seebeck coefficients at 300 K of the bulk materials −30.8 μV/K for cobalt and 1.9 μV/K for gold, the Peltier coefficient at the cobalt-cold interface is estimated as 9.8 mV by Eq. 1, which indicates presence of the cooling effect by the positive current. In the present example, the Peltier coefficient was obtained approximately −70 μV/K by applying Eq. 2 to the data in FIG. 8, which value is the Peltier coefficient as a whole of the CPP structure (the sum of the coefficients at 5 interfaces). The signs of the obtained Peltier coefficient (−70 μV/K) is coincident to the Peltier coefficient from the data of bulk materials (−32.7 μV/K for cobalt-cold interface), but the magnitude of the obtained Peltier coefficient is larger than that of the estimated value. The reason why the obtained Peltier coefficient is larger than the estimated value from the bulk data is not clear yet. One possible explanation is that the Peltier coefficient may have a size-effect (enhancement by the micron size of the structure) which was reported in Non-patent Document 1.

EXAMPLE 2

Figure 9:
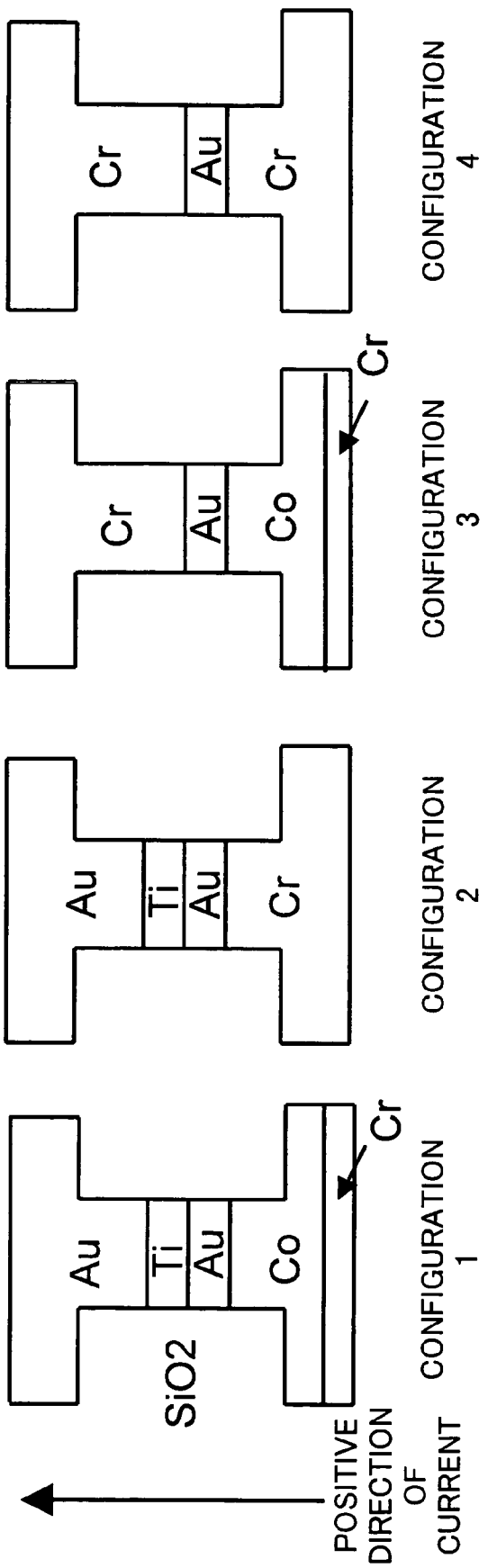
FIG. 9 shows various configurations of CPP-CIC wirings.

FIG. 9 shows examples of CPP-CIC wirings having a various kind of the interfaces (cobalt-gold, chrome-gold, cobalt-chrome, and chrome-chrome) with a simpler structure. Those structures are shown in FIG. 9. Those devices were prepared by the same method as in the foregoing example, namely, by processing a multilayer of metal films on a thermally oxidized silicon wafer formed into a CPP structure by microfabrication. The columnar part of each device had the cross section of 200 nm×70 nm and the height of 50 to 60 nm, and is surrounded by silicon oxide.

In order to confirm that the cooling effect of the invention is due to the Peltier effect, four kinds of CPP-CIC wirings without GMR layers were fabricated. Details of those devices are as follows:

Configuration 1: The CPP-CIC wiring was made of a multilayered metal film consisting of 10 nm of chrome, 100 nm of cobalt, 20 nm of gold (lower layer), 20 nm of titanium, and 200 nm of gold (upper layer). The columnar portion was comprised of a portion of the cobalt layer, the gold layer (lower layer), titanium layer, and a portion of the gold layer (upper layer).

Configuration 2: The CPP-CIC wiring was made of a multilayered metal film consisting of 100 nm of chrome, 20 nm of gold (lower layer), 20 nm of titanium, and 200 nm of gold (upper layer). The columnar portion was comprised of a portion of the chrome layer, the gold layer (lower layer), titanium layer, and a portion of the gold layer (upper layer).

Configuration 3: The CPP-CIC wiring was made of a multilayered metal film consisting of 10 nm of chrome (lower layer), 100 nm of cobalt, 20 nm of gold, and 200 nm of chrome (upper layer). The columnar portion was comprised of a portion of the cobalt layer, the gold layer, and a portion of the chrome layer (upper layer).

Configuration 4: The CPP-CIC wiring was made of a multilayered metal film consisting of 100 nm of chrome (lower layer), 20 nm of gold, and 200 nm of chrome (upper layer). The columnar portion was comprised of a portion of the chrome layer (lower layer), the gold layer, and a portion of the chrome layer (upper layer).

By the first-order approximation, the expected Peltier coefficients of the CPP-CIC wirings are that of cobalt-cold interface for Configuration 1, that of chrome-gold interface for Configuration 2, that of cobalt-chrome interface for Configuration 3, and that of chrome-chrome interface for Configuration 4. The thermoelectric powers of the materials used in the devices are −30.8 μV/K for cobalt, 21.8 μV/K for chrome, and 1.9 μV/K for gold, which are the data of the bulk materials. Therefore, the cooling effect can be expected in Configurations 1, 3 and Example 1 (shown in FIG. 7) by the current of the positive direction (which is from the lower electrode to the upper electrode) and in Configuration 2 by the current of the negative direction, while no cooling effect can be expected in Configuration 4.

Figure 10:
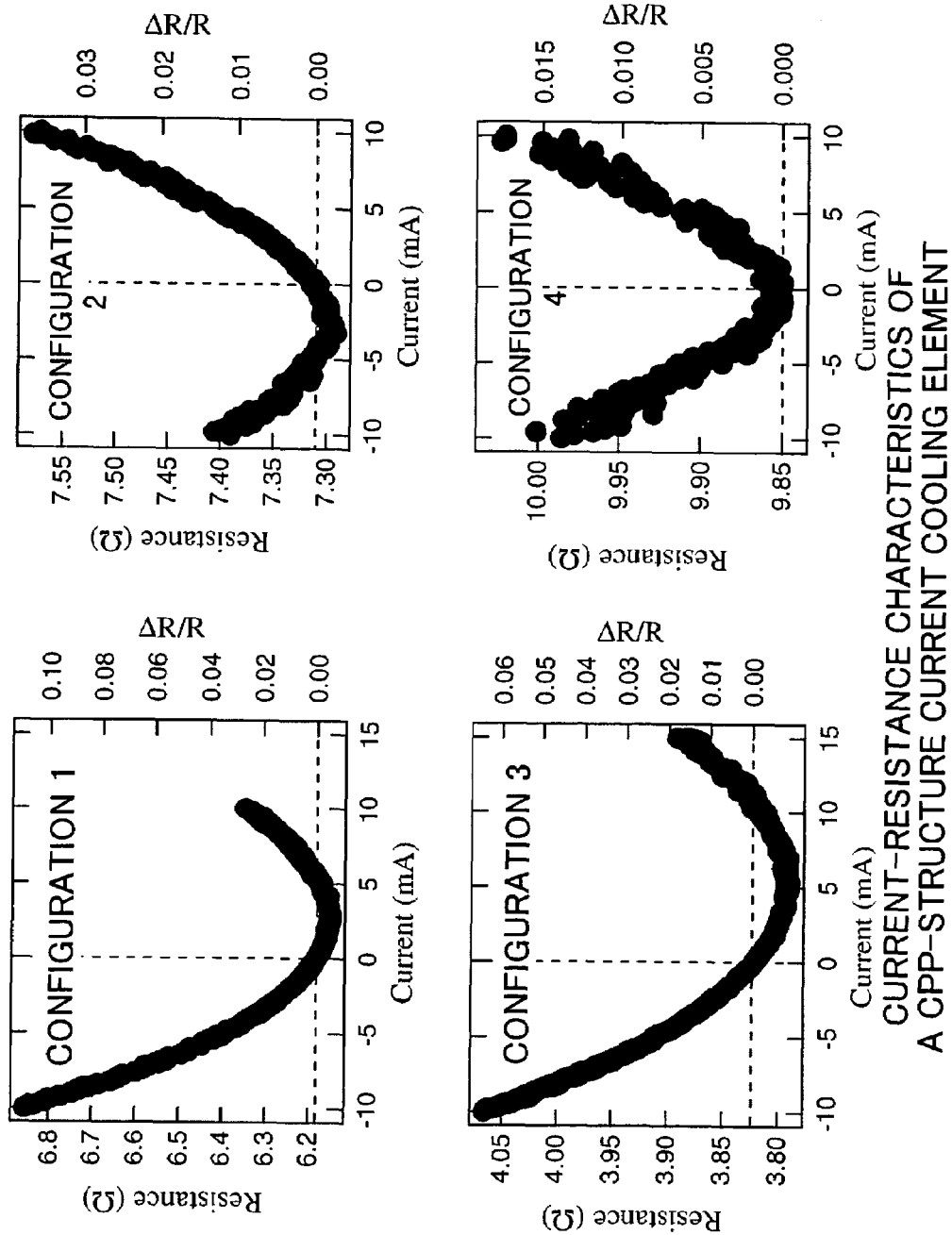
FIG. 10 shows graphs illustrating the current-resistance characteristics of the CPP-CIC wirings shown in FIG. 9.

FIG. 10 shows current-versus-resistance graphs of the CPP-CIC wirings of Configurations 1 to 4 as shown in FIG. 9. It can be seen from these graphs that the region where the resistance is smaller than the zero-current-resistance exists in the positive direction of current in Configurations 1 and 3, and in the negative direction of current in Configuration 2, while no region of decreasing the resistance from the zero-current-resistance exists in Configuration 4. Because that these wirings are made of metal films, the temperature coefficients of the resistance of the wirings are positive (i.e., the resistance increases with increasing temperature). Therefore, the decrease in resistance indicates the presence of the current cooling effect. In the case of Configurations 1 and 2, the temperature coefficients of the resistance were of the order of 5 mΩ/K, and the maximum decrements of the temperature due to the current cooling effect is estimated approximately 5 K.

By applying the results of the present experiment to Eq. 2, the Peltier coefficient of the CPP-CIC wirings could be estimated. The obtained values are also greater than those of bulk materials, specifically, 115 μV/K for Configuration 1, −100 μV/K for Configuration 2, and 139 μV/K for Configuration 3. This is another evidence of the enhancement of the Peltier coefficient due to decreasing the size of the devices. Such enhancement in the Peltier coefficient in a micron-size device was reported in Non-patent Document 1.

EXAMPLE 3

Figure 11:
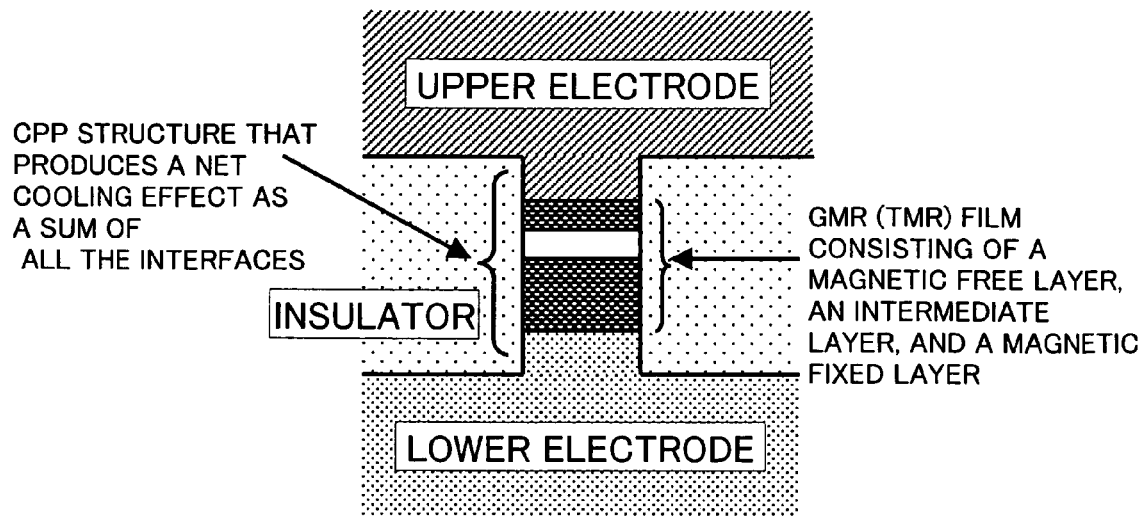
FIG. 11 shows a structure of a magnetic sensor employing a CPP-GMR device with the CPP-CIC structure.

Using a CPP-GMR device or a TMR (tunnel-magnetoresistance) device with the CPP-CIC structure of the invention, the following applications are conceivable. A TMR device is a magneto-resistance device with the same configuration of a CPP-GMR device except that a tunnel barrier is used as an intermediate layer. A TMR device inherently has the CPP structure, because current should flow through the tunnel barrier. For example, a CPP-GMR (TMR) device is used as a magnetic-field sensor, such as the read-head of hard-disks. The invention could be adapted to a CPP-GMR (TMR) device without any modification on those structures. A CPP-GMR (TMR) device of the invention which has current induced cooling effect will be hereafter referred to as "a CPP-GMR (TMR) device with the CPP-CIC structure." In this structure, at least a magnetic free layer, an intermediate layer, and a magnetic fixed layer are provided in the columnar portion as shown in FIG. 11, and a proper combination of materials is adopted such that the current-cooling effect can be obtained. Alternatively, a portion of the magnetic fixed layer may be formed in the lower electrode, as in the case of Example 1. Further alternatively, a structure may be adopted such that a ferri-magnetic structure is employed in the magnetic fixed layer, or an antiferromagnetic layer may be provided below the magnetic fixed layer to optimize the magnetic properties. These structures may also be combined.

Figure 12:
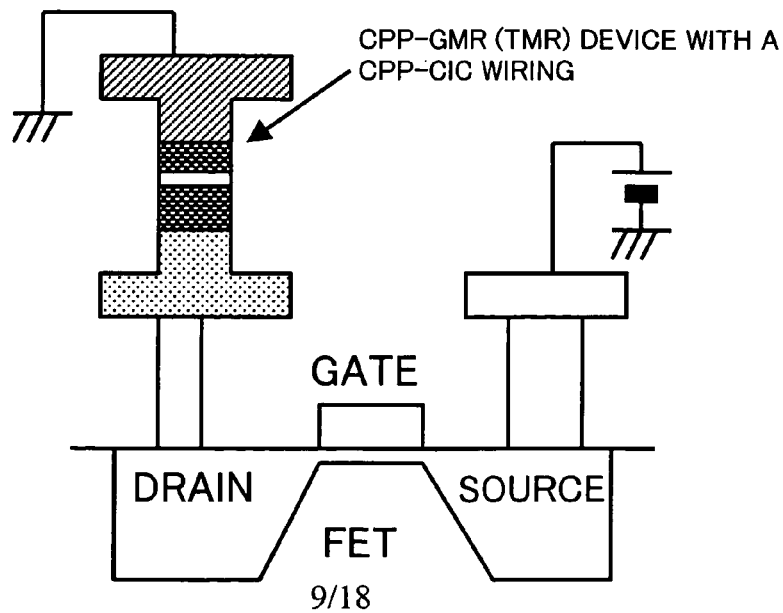
FIG. 12 shows an example of a magnetic memory employing a CPP-GMR device with the CPP-CIC structure.

It is also possible to use the CPP-GMR (TMR) device with the CPP-CIC structure as. a memory element in a MRAM (magnetic-random-access-memory). The invention can be compatible with both the field magnetization reversal method and the current-induced magnetization reversal method for the data-writing of a MRAM. FIG. 12 shows an example of the structure of one cell (1 bit) of a MRAM using the current-induced magnetization reversal method. In the figure, a circuit for the data-reading is omitted. By integrating a large number of these elements, a MRAM device can be constructed.

Figure 13:
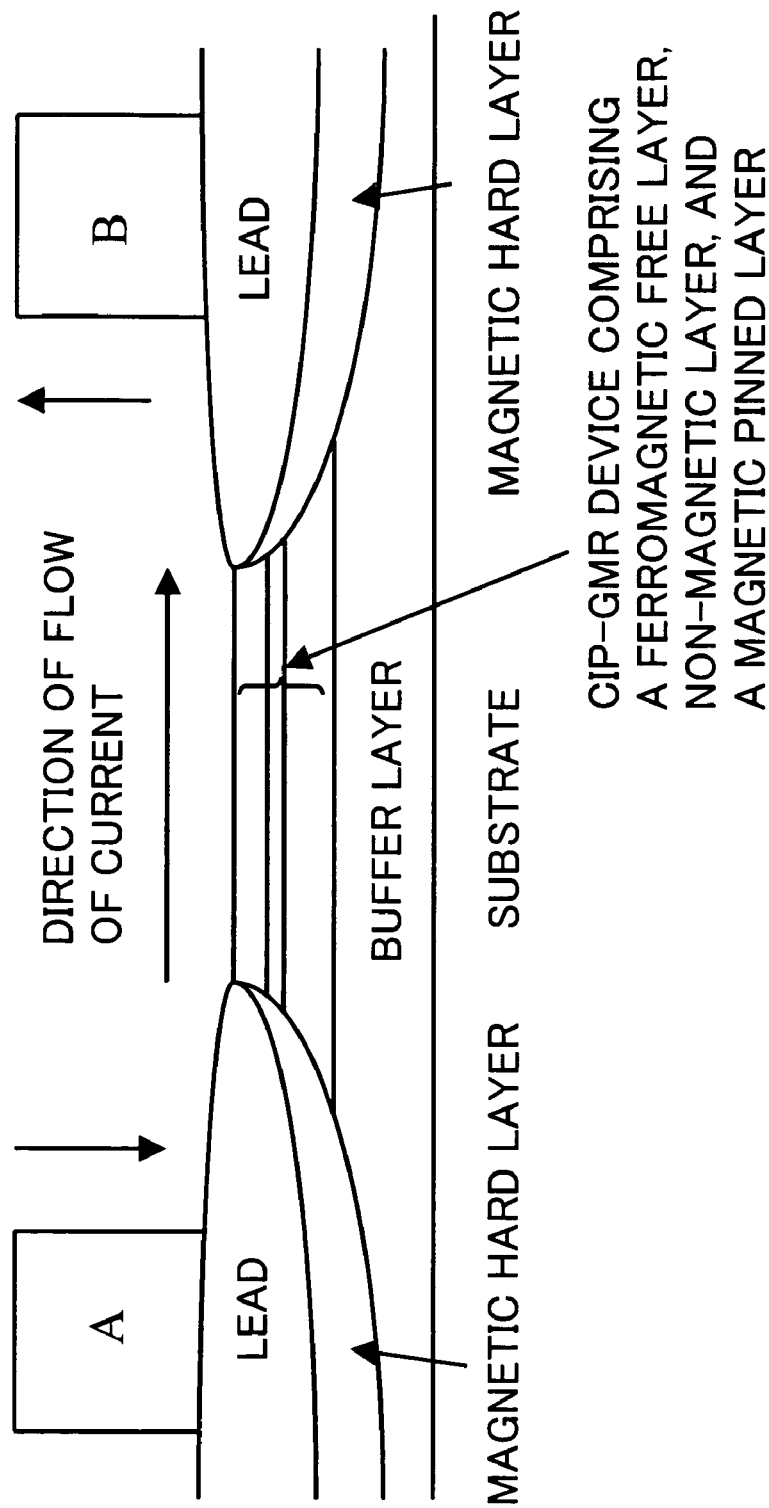
FIG. 13 shows an application of the CPP-CIC wiring with separate two columns to a CIP (current-in-plain)-GMR magnetic head for hard-disk drive.

As a method of cooling a magnetic read-head of a hard-disk, the CPP-CIC wiring of the invention can be incorporated at the electric-lead part of the magnetic read-head. One example of a CIP (current-in-plane) structure GMR read-head of a hard-disk is described below. A GMR device with the CIP structure is used in some of the current hard-disks. In the CIP structure the sense current flows along the magnetic multilayered film, then the Joule heating by the current will be generated. To add the current cooling effect by the invention, the CPP-CIC wiring with the separate configuration is desirable which is shown in FIG. 3(B). FIG. 13 shows the structure of a CIP-GMR device used as a read-head of a hard-disk having the current cooling effect by the invention. The sense current is assumed to flow from the lead portion on the left of the drawing along the CIP-GMR layer to the lead portion on the right. In this case, the CPP-CIC wiring comprises two columns of materials A and B at the left and right lead portions, respectively. This structure corresponds to that shown in FIG. 3(B).

When absolute value of sum of the Seebeck coefficients of the materials used in the CIP-GMR part is not large (less than several μV/K), the current cooling effect can be obtained by using a material with negative Seebeck coefficient, such as cobalt or nickel, for material A, and by using a material with a positive Seebeck coefficient, such as chrome or iron, for material B. In this example, the cross section of the CPP-CIC wiring is not particularly limited. In principle, the cooling effect can be obtained with any size. Furthermore, there is the possibility that a enhancement of the current cooling effect can be exhibited by reducing the size of the CPP-CIC wiring, as found by the inventors.

It is also possible to dispose two CPP-CIC wirings at the place of A and B in FIG. 13. In this case, it is necessary to optimize the configuration of the CPP-CIC wiring for the portions A and B with respect to the direction of the current such that the current cooling effect can be exhibited at both A and B. For example, when absolute value of sum of the Seebeck coefficients the materials used in the CIP-GMR part is not large (less than several μV/K), a two CPP-CIC wiring, one comprises cobalt-gold may be employed at portion A, another comprises gold-chrome may be employed at portion B, can be used for the cooling effect.

EXAMPLE 4

One of the advantages of the structure of the invention is that the resistance value of the structure itself can be very small, because the current cooling effect can be provided by the multilayered film of metals. For example, the resistance value of the CPP-CIC structure made of the metal films with a cross-sectional size of 0.1 micrometer square is on the order of several ohms. In this case, the voltage drop at the relevant portion is no more than several tens of millivolts even if a current of several milliamperes flows, which is sufficient to produce the cooling effect. Therefore, it is possible to incorporate the CPP-CIC wiring of the invention in a conventional electronic device as a wiring part (as a part connected to the power supply, for example) without adversely affecting the operation thereof. In a possible application, the CPP-CIC wiring of the invention can be incorporated at a terminal of an active electronic device, such as a diode or a transistor.

Figure 14:
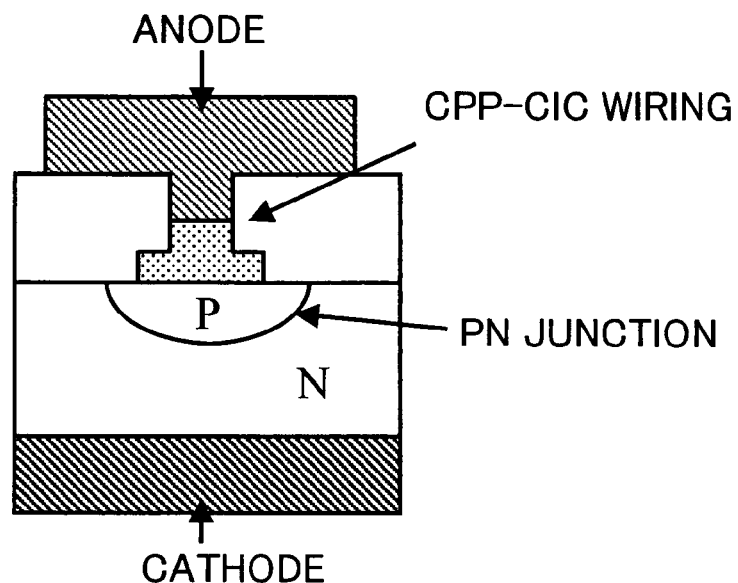
FIG. 14 shows an application of the CPP-CIC wiring to a diode.

FIG. 14 shows an example of the application of the CPP-CIC wiring to a diode. In the diode shown in FIG. 14, the CPP-CIC wiring that produces the cooling effect when a current flows in the forward direction is disposed on the anode (or cathode) side. In this case, the amount of heat generated by the loss in the forward direction can be reduced. The material of the CPP-CIC wiring may be the same as that of the anode or cathode electrode. Alternatively, the materials of which the semiconductor junction is made may be used as part of the material of the CPP-CIC wiring.

Figure 15:
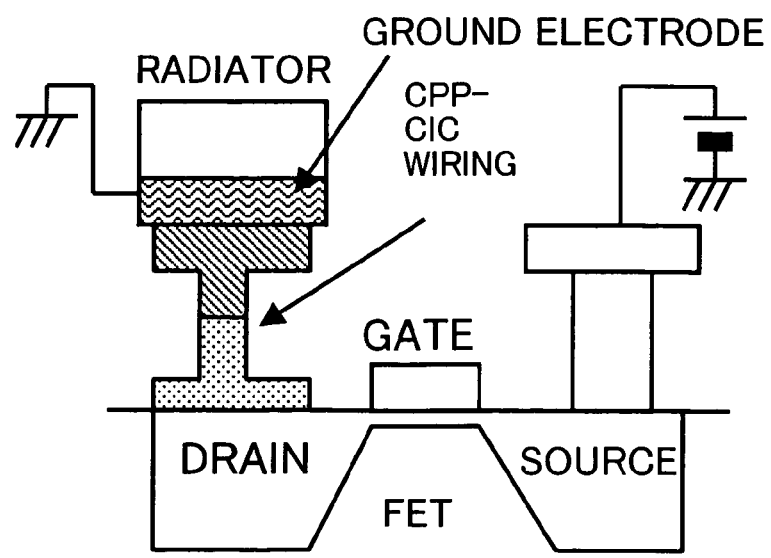
FIG. 15 shows an application of the CPP-CIC wiring to an FET.

Furthermore, it is also possible to incorporate the CPP-CIC wiring in an electrode of a FET (transistor) as shown in FIG. 15. By providing the CPP-CIC wiring on the drain (emitter) or source (collector) side, the generation of heat at the junction during the operation of the FET (transistor) can be reduced. In this case too, the materials of which the electrodes or the semiconductor junction of the FET (transistor) are made may be used as part of the material of the CPP-CIC wiring.

EXAMPLE 5

The CPP-CIC wiring of the invention can be incorporated as part of a wiring circuit without adversely affecting the performance of the existing semiconductor integrated circuit, because the inherent resistance value can be small. Specifically, the CPP-CIC wiring can be adapted in a via-hole wiring structure (also referred to as a through-hole structure), which has a role that a current flows in a direction perpendicular to the plane of a multilayered integrated circuit. By providing an interface of different kinds of materials with the proper combination at the via-hole wiring, the current cooling effect can be obtained when current flows. In this case, the following applications are conceivable.

Normally, in a multilayered integrated circuit, the electronic elements in each layer are electrically insulated by an insulator (such as silicon oxide or aluminum). These insulators generally have low heat conductivity, such as on the order of one to several W/mK. In such a multilayered integrated circuit, the functional electronic elements on the intermediate layer (in other words, the deep portion) of the integrated circuit would be thermally isolated from the outside of the circuit. Under these circumstances, the heat generated during the operation of the elements tends to be accumulated inside the integrated circuit; thereby the functional elements will be heated. Generally, high temperatures in the operating environment of electronic elements are undesirable from the viewpoints of reliability, longevity and other factors. The heat inside the integrated circuits, particularly the localized heat at the deep portion thereof, can be efficiently reduced by the invention.

Figure 16:
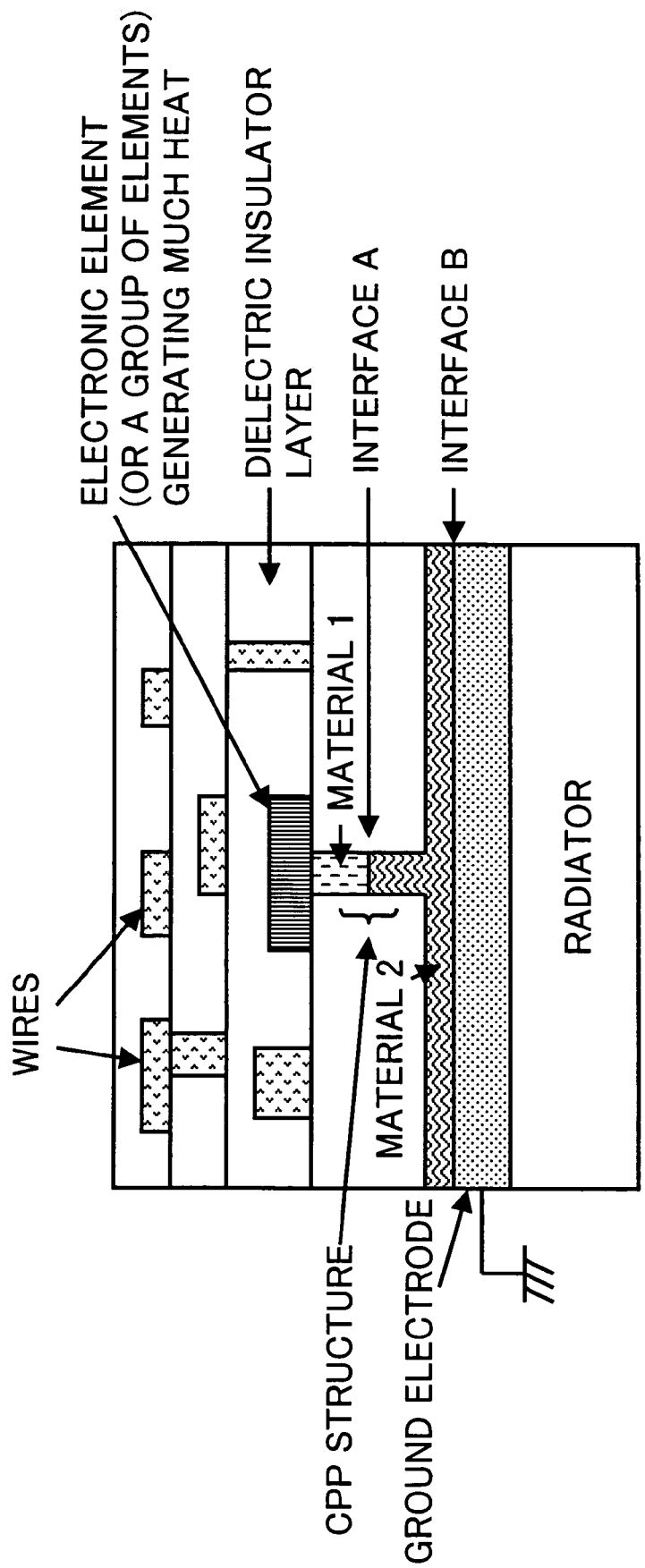
FIG. 16 shows a first example of an application of the CPP-CIC wiring to an integrated circuit.

FIG. 16 shows a first example of the use of the CPP-CIC wiring in an electronic circuit with a multilayered structure. An element (or a group of elements) expected to generate much heat is disposed at the intermediate layer of a multilayered structure, and is surrounded by an insulator. What is important in this example is that the heat-generating element and the CPP-CIC wiring are electrically connected in series. The CPP-CIC wiring may be connected either between the heat-generating element and ground, or between the power supply and the heat-generating element, or via a combination of both.

When a current is provided for the heat-generating element, the same current shall flow through the CPP-CIC wiring. At that time, a cooling at interface A and the same amount of a heating at interface B occur simultaneously due to the Peltier effect. Hereafter this heating is referred as the compensation-heating. When interface A exists near the heat-generating element and is also electrically connected thereto, the generated heat by the electronic element can be quickly absorbed at interface A and then dissipated at interface B. In another point of view, the CPP-CIC wiring is regarded as a heat transfer device with highly efficiency. The dissipation of the heat can be further facilitated by enlargement of the surface of interface B and by disposing interface B at the outermost portion of the multilayered structure. Moreover it could be possible to increase the efficiency of transfer the generated heat to outside of the integrated circuit by a bi-layer structure of the bottom part of the CPP-CIC wiring and the metal electrode (such as the ground electrode), which result in enhancement of the surface of interface B, as shown in FIG. 16. Arrangement such that the metal electrode with surface B is attached directly to the outside package (or a radiator) is also effective. It should be noted that the CPP-CIC wiring of the invention does not require a separated power supply for cooling purposes.

In this first example, constituent materials 1 and 2 of the CPP-CIC wiring may comprise simple metals, a multilayered metal structure, or a multilayered semiconductor structure with high electrical conductivity. What is important is that the cooling effect is exhibited effectively at interface A and that the compensation-heating is dissipated at interface B sufficiently.

EXAMPLE 6

FIG. 17 shows a second example of an integrated circuit, illustrating the various manners (A) to (C) in which the CPP-CIC wiring with plural CPP-CIC structures and the heat-generating element are disposed. The arrangement of the multiple CPP-CIC structures connecting to the heat-generating element and its cooling performance will be described.

FIG. 17(A) shows an example of the CPP-CIC wiring with two CPP-CIC structures which are connected to a heat-generating element. When the amount of heat that can be cooled by a single CPP-CIC wiring is Q, this CPP-CIC wiring has a cooling power of 2Q. As mentioned above, the CPP-CIC wiring of the invention has a limited range of current for the cooling effect, which is the current from 0 to II/R. On the contrary, in the case of the CPP-CIC wiring with plural CPP-CIC structures, the current can be divided and can not exceed the limited range, and consequently a larger cooling power can be obtained. In other words, by connecting a plurality of CPP-CIC structure in parallel, the range of current for the cooling effect can be extended.

FIG. 17(B) shows an example of the CPP-CIC wiring with nine CPP-CIC structures which are connected to a heat-generating element. In this case, the CPP-CIC wiring has a cooling power of 9Q, when the cooling power per CPP-CIC structure is Q. When the area of the heat-generating element is small to connect the plural CPP-CIC structures, a buffer layer of metal, for example, may be provided between the head of plural CPP-CIC structures and the heat-generating element as shown in FIGS. 17(B) and 17(C) so that the number of CPP-CIC structures which connect to the heat-generating element can be increased.

FIG. 17(C) shows an example of the CPP-CIC wiring with an array of CPP-CIC structures (the array consisting of forty CPP-CIC structures in the illustrated example) which are connected to a heat-generating element. There is no processing difficult involved in fabricating such a plurality of CPP-CIC structures in an integrated circuit. This example has a cooling power of N×Q, when the cooling power per CPP-CIC structure is Q and the number of CPP-CIC structures in the array is N. In these examples, the heat-generating element may be a single electronic element or a group of electronic elements.

EXAMPLE 7

Figure 18:
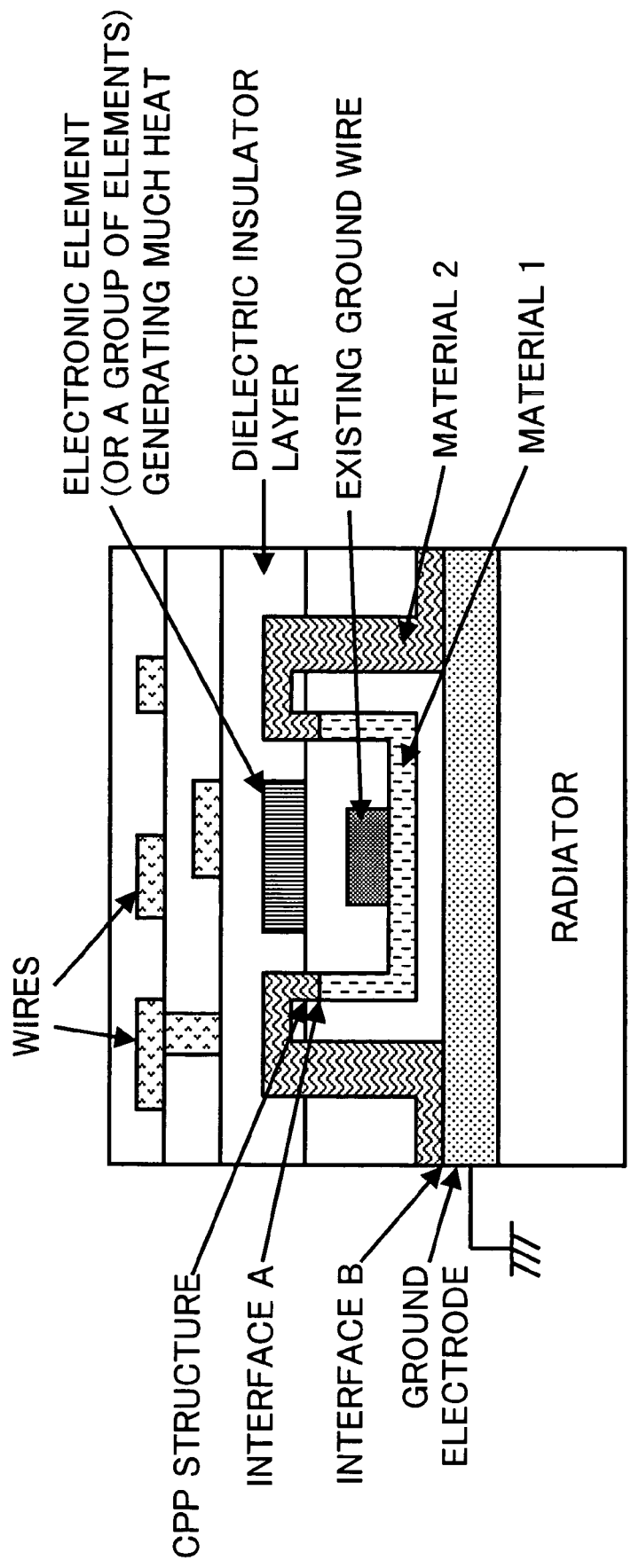
FIG. 18 shows a third example of the application of the CPP-CIC wiring to an integrated circuit.

FIG. 18 shows a third example of the use of the CPP-CIC wiring of the invention in an existing integrated circuit with a multilayered structure. In this example a heat-generating element is disposed at the center of a multilayered insulator, and a CPP-CIC wiring with plural CPP-CIC structures is connected electrically between an existing ground wiring and a new ground electrode. Those CPP-CIC structures are disposed around the heat-generating element such that the cooling interfaces locate as near the heat-generating element as possible. Because of the small resistance of the CPP-CIC wiring, an additional power source will not be necessary.

In this case, a shape of the CPP-CIC structure is not straight. The electrode part is extended for easy access of the wiring. What is important for the production of the current cooling effect is solely the fact that a current flows through the CPP-CIC structure with a proper direction. Therefore, the manner of arrangement of each CPP-CIC wiring has a certain degree of freedom.

EXAMPLE 8

The CPP-CIC device in accordance with the invention is characterized in that a sub-micron size columnar structure having an interface of different materials with a proper combination provides the current cooling effect (Peltier effect). Conversely, if a temperature difference exists between at the interface in the columnar part and at the interface in the electrode, a voltage which corresponds to product of the temperature difference and the Peltier coefficient is produced. This phenomenon is based on the same principle as that of the thermocouple.

Figure 19:
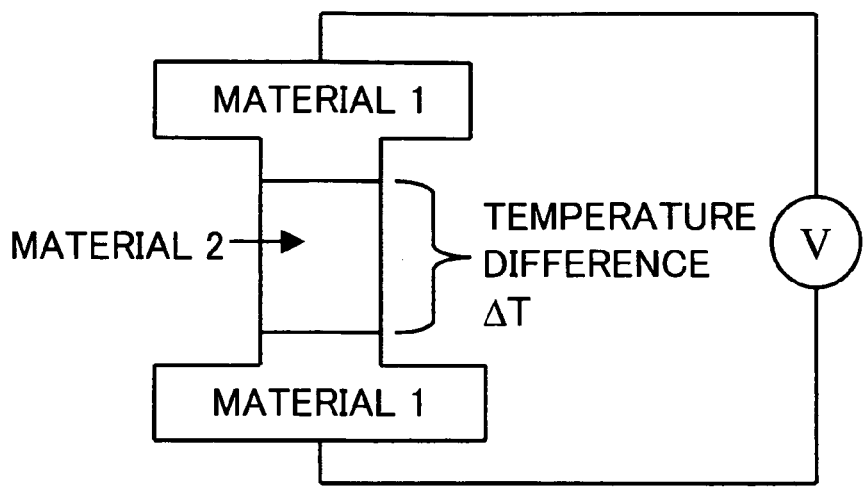
FIG. 19 shows a basis of CPP thermocouple.

Here, an application of the CPP-CIC device to a temperature sensor based on the aforementioned principle will be described. The present sensor will hereafter be referred to as "a CPP thermocouple." Referring to FIG. 19, a multilayered film consisting of two materials with a large difference in the Seebeck coefficient, namely, materials 1 and 2, is processed into an device with a structure "material 1—(lower interface)—material 2—(upper interface)—material 1" in the columnar portion. In this device, when a temperature difference $\Delta T$ exists between the lower interface and the upper interface, a voltage output V is obtained between the lower electrode and upper electrode, as shown in the following equation:

$$V = \pi \times \Delta T \quad (3)$$

where $\pi$ is the Peltier coefficient determined by the difference in the Seebeck coefficients of materials 1 and 2.

Figure 20:
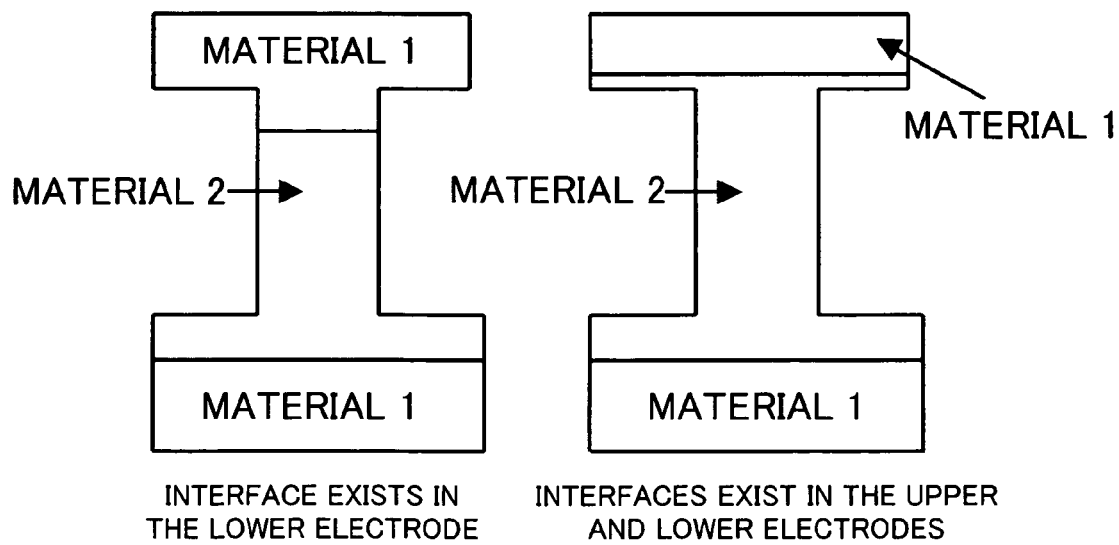
FIG. 20 shows an example of the structure of a CPP thermocouple.

In the CPP thermocouple in accordance with the invention, what is important is to provide a temperature difference between the two interfaces. Therefore, the interface does not necessarily have to be located inside a columnar portion. For example, one interface may be disposed inside the upper electrode and the other interface may be disposed inside the lower electrode, as shown in FIG. 20. Preferably, one electrode constitutes a portion whose temperature does not rise (a heat-sink portion), and the other electrode does a portion whose temperature can easily rise due to the heat from the outside (a heat-sense portion); and the two interfaces are disposed at the heat-sink portion and the heat-sense portion, respectively.

Figure 21:
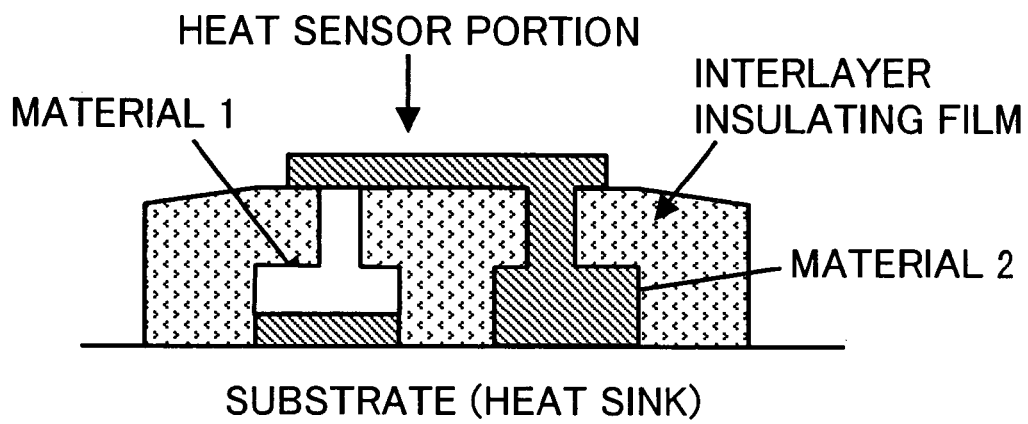
FIG. 21 shows an example of a π-type CPP thermocouple.
Figure 22:
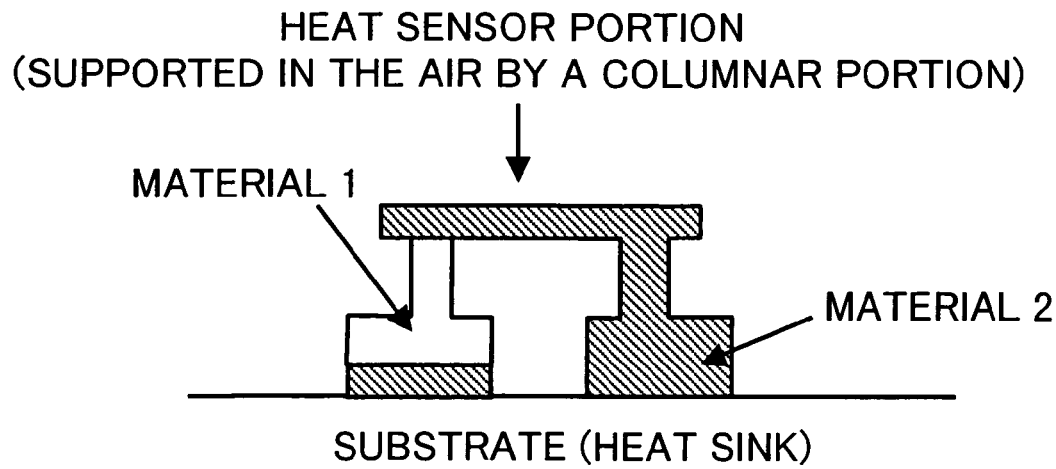
FIG. 22 shows an example of an aerial π-type CPP thermocouple.

The sensitivity of the CPP thermocouple can be enhanced by reducing the heat capacity of the heat-sense portion, or by reducing the thermal conduction between the heat-sink portion and heat-sense portion so as to more readily provide the temperature difference between the two interfaces. From these viewpoints, it is possible to divide the column portion of the CPP thermocouple into two portions so that the heat-sense portion is independently provided, as shown in FIG. 21. A device with such a shape is generally referred to as a π-type structure. In the π-type structure, the sensitivity of the sensor can be further enhanced by reducing the size of the heat-sense portion into micrometer order by microfabrication. In another method of reducing the thermal conduction between the heat-sink portion and the heat-sense portion, the interlayer insulating film around the column portions can be removed and the heat-sense portion can be supported by the column portions as if it is floating in the air, as shown in FIG. 22. In this way, the sensitivity of the sensor can be further improved.

The sensitivity of the CPP thermocouple can be also improved by connecting the devices in series. Specifically in the CPP thermocouples with the π-type structure, to provide the same temperature difference between the heat-sense portion and the heat-sink portion of each CPP thermocouple, the heat-sense portions of plural devices are thermally contacted to an object which temperature will be measured, and the heat-sink portions are thermally contacted to the substrate which temperature is not changed. The isolations between the heat-sense portions and that between the heat-sink portions are needed. In this way, the output voltage can be increased in proportion to the number of the devices. Such a structure in which a number of thermocouples connected in series is referred to as a thermopile structure.

Figure 23:
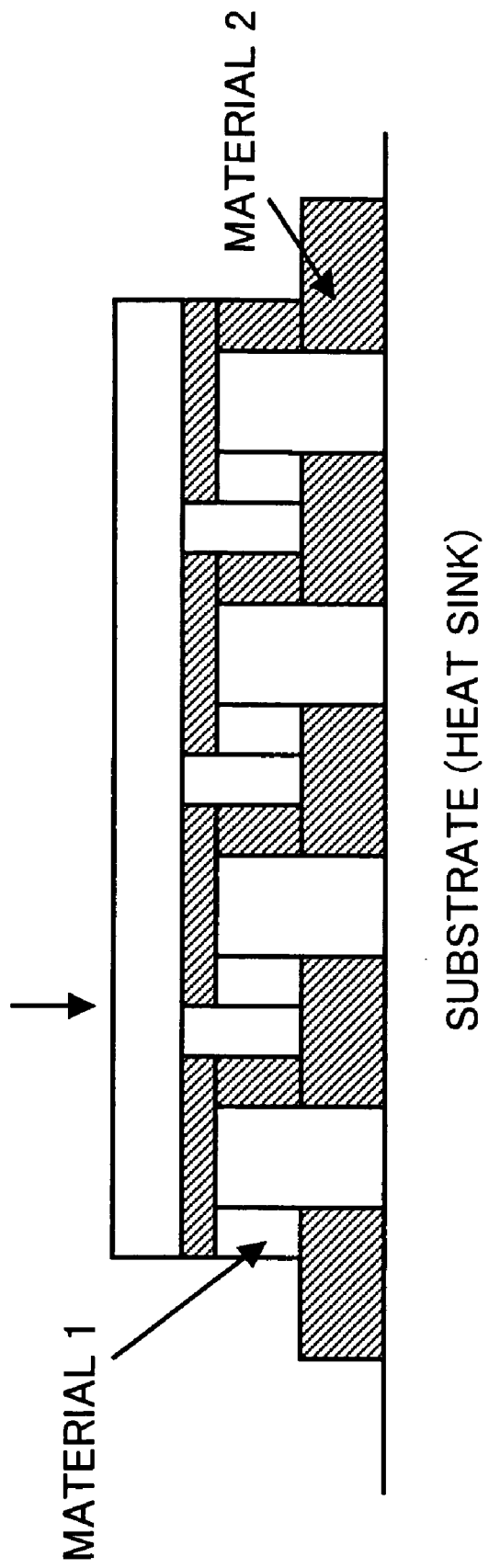
FIG. 23 shows an example of a thermopile using plural CPP thermocouples connected in series.

One possible application of the CPP thermocouple with the thermopile structure is an infrared sensor. FIG. 23 schematically shows an example of an infrared sensor of the relevant structure. In this sensor, the intensity of infrared rays is detected in terms of a temperature increase in the heat-sense plate, to which all heat-sense portions of the CPP thermocouples are contacted. Preferably, the heat-sense plate has a bi-layer structure comprising a metal film and an insulator film to obtain the isolation between plural heat-sense portions and the thermal uniformity in the heat-sense plate simultaneously. In the case of the arrangement as shown, as much as four times larger output voltage than that of a single CPP thermocouple can be obtained.

EXAMPLE 9

As shown in Example 8, the CPP thermocouple of the invention can be also used as a very small temperature sensor. Because the CPP thermocouple of the invention can be greatly reduced in size, specifically to one micrometer square or less, the heat capacity of the device can be reduced by three or more orders of magnitude as compared with the conventional thermocouples (with the minimum diameter of approximately 25 micrometers). Thus, the CPP thermocouple of the invention is suitable for the detection of a temperature change in a minute range, or a temperature change in a minute sample. It would be possible to detect a temperature change in 1 pl (pico-liter) or less of a sample with a resolution better than 0.1° C. by the CPP thermocouple, because of the fact that the volume of the heat-sense portion with a size of 0.1 micrometer cubic is on the order of 1 al (atto-liter).

Figure 24:
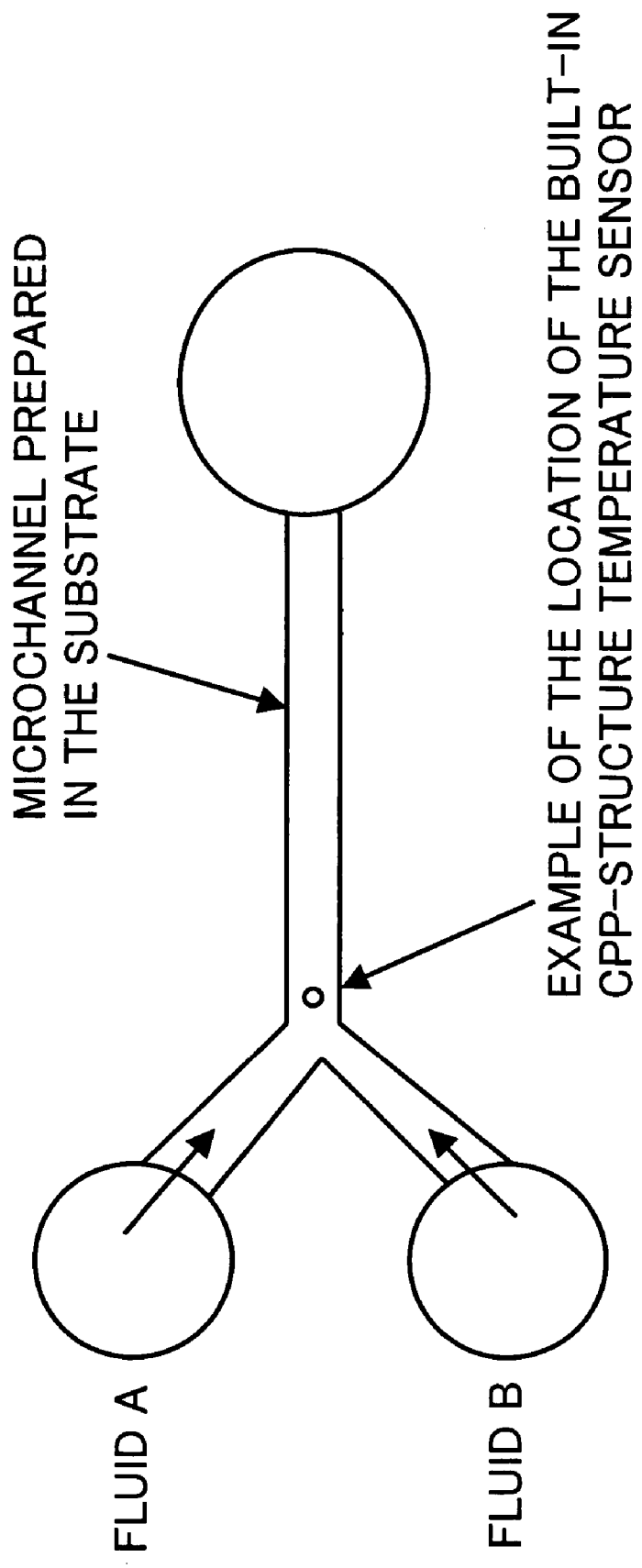
FIG. 24 shows an example of the application of a CPP thermocouple into a micro-channel bio-chip as a small temperature sensor.

FIG. 24 shows an example of a micro-channel bio-chip into which the CPP thermocouple has been built. The CPP thermocouple in accordance with the invention is built along a micro-channel (with a width on the micrometer order) prepared on a substrate. When the CPP thermocouple is a single column structure, it can be built inside the micro-channel such that the columnar portion (a heat-sense portion) is directly contacted with the fluid. When the CPP thermocouple is a π-type structure or a thermopile structure, it can be built inside the micro-channel such that the heat-sense portion (a heat-sense plate) is directly contacted with the fluid. In the illustrated arrangement, the heat of reaction (or the heat absorbed of reaction) of two kinds of fluids A and B can be detected by the CPP thermocouple of the invention.

SUMMARY OF DESCRIPTIONS

The electronic device and the electronic wiring with the current cooling effect in accordance with the invention can be applied for preventing the generation of heat inside the integrated circuits or electronic devices used in the information and communications industry, various memories (such as magnetic random access memories), arithmetic elements, transistors, and storage unit components (such as magnetic heads), for example.

The electronic device with the Peltier effect in accordance with the invention can be applied for detecting the temperature difference especially in a smaller size, the intensity of inferred lay, for example.

What is claimed is:

1. A semiconductor integrated circuit having a multilayered structure, comprising:
   a heat-generating element; and
   a CPP-CIC wiring for electrically connecting between a ground and said heat-generating element and/or between a power supply and said heat-generating element,
   wherein said CPP-CIC wiring comprises a columnar portion comprising thin films or layers layered in a direction perpendicular to planes of the films or layers,
   wherein a current flows along said columnar portion, and said CPP-CIC wiring functioning solely as a lead wire to a power supply and/or to the ground provides no electrically active function,
   wherein said CPP-CIC wiring includes a heat-generating interface and a heat-absorbing interface, the heat-absorbing interface being between different kinds of materials,
   wherein said different kinds of materials are selected from materials which produce a Peltier cooling effect at said heat-absorbing interface when a current flows therethrough, and a Peltier heating effect at said heat-generating interface when a current flows therethrough, and
   wherein said heat-absorbing interface is disposed such that the heat generated by said heat-generating element can be absorbed by said heat-absorbing interface.

2. The semiconductor integrated circuit according to claim 1,
   wherein said heat-generating interface is disposed at an outer-most portion of the integrated circuit.

3. The semiconductor integrated circuit according to claim 1,
   wherein a radiator is disposed at said heat-generating interface.

4. The semiconductor integrated circuit according to claim 1,
   wherein said CPP-CIC wiring includes a plurality of wirings connected in parallel.

5. The semiconductor integrated circuit according to claim 1,
   wherein said CPP-CIC wiring includes a plurality of wirings arranged in a array.

6. The semiconductor integrated circuit according to claim 1,
   wherein said CPP-CIC wiring includes a plurality of wirings disposed around said heat-generating element.

* * * * *